United States Patent
Kobayakawa

(10) Patent No.: US 6,576,986 B2
(45) Date of Patent: Jun. 10, 2003

(54) SEMICONDUCTOR DEVICE WITH RESIN PACKAGE

(75) Inventor: Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/783,984

(22) Filed: Feb. 16, 2001

(65) Prior Publication Data

US 2001/0015486 A1 Aug. 23, 2001

(30) Foreign Application Priority Data

Feb. 21, 2000 (JP) ........................................ 2000-043188

(51) Int. Cl.[7] ............................................. H01L 23/495
(52) U.S. Cl. ........................ 257/676; 257/684; 257/787; 257/796
(58) Field of Search .................................. 257/684, 787, 257/687, 796, 666, 712, 675, 676, 713

(56) References Cited

U.S. PATENT DOCUMENTS

| | | | | |
|---|---|---|---|---|
| 4,945,398 A | * | 7/1990 | Kurita et al. | 257/665 |
| 5,508,557 A | * | 4/1996 | Sunada | 257/692 |
| 5,528,079 A | * | 6/1996 | McIver | 257/698 |
| 5,821,611 A | | 10/1998 | Kubota et al. | 257/673 |

* cited by examiner

Primary Examiner—Nathan J. Flynn
Assistant Examiner—Leonardo Andújar
(74) Attorney, Agent, or Firm—Michael D. Bednarek; Shaw Pittman LLP

(57) ABSTRACT

A semiconductor device is provided with a first one-piece lead, a semiconductor chip mounted on the first lead, a second one-piece lead connected to the chip, and a resin package for enclosing the semiconductor chip together with a part of each lead. The second lead includes a flexible end connected to the chip by a conductive material. This flexible end is smaller in width than the remaining portion of the second lead.

7 Claims, 5 Drawing Sheets

SEMICONDUCTOR DEVICE WITH RESIN PACKAGE

BACKGROUND OF THE INVENTION

1. Field of the Invention

The present invention relates to a semiconductor device with a resin package to enclose a semiconductor chip.

2. Description of the Related Art

FIGS. 5–7 of the accompanying drawings show a conventional package type semiconductor device. The illustrated device includes a first lead 1', a second lead 2', a semiconductor chip 3' and a synthetic resin package 4' to enclose the chip 3', the inner portion 1a' of the first lead 1' and the inner portion 2a' of the second lead 2'. As seen from FIGS. 6 and 7, the inner portion 1a' has a width W1' which is greater than the width of the remaining portion of the lead 1'. Similarly, the inner portion 2a' has width W2' which is greater than the width of the remaining portion of the lead 2'. The width W1' is equal to the width W2'. The chip 3' is mounted on the enlarged inner portion 1a' of the first lead 1', while also being connected to the enlarged inner portion 2a' of the second lead 2'. With this structure, the heat generated at the chip 3' is efficiently conducted to the first and the second leads 1', 2', which is advantageous to maintaining the proper function of the device.

However, the enlarged inner portions 1a' and 2a' of the leads 1' and 2' are not readily bent when the resin package 4' is bent upon application of an external force. Thus, unfavorably, a crack may be generated in the bent package 4' by the rigid inner portions 1a' and 2a'. One way to address this problem is to enlarge the height H' and/or the width S' of the package 4'. The enlargement of the package 4', however, leads to an increase in size and weight of the resulting semiconductor device.

FIGS. 8 and 9 show another conventional semiconductor device in which a relatively narrow connector 5' is used for connecting the semiconductor chip 3' to the second lead 2'. In this device, a crack is less liable to form in the package 4' since the narrow connector 5' can be readily bent together with the package 4'. However, the illustrated structure will cause an increase in production cost since the auxiliary connector 5' must be prepared separately from the first and the second leads 1', 2'. In addition, since the connector 5' is not integrally formed with the second lead 2', the unfavorable heat may not be conducted efficiently from the semiconductor chip 3' to the lead 2'.

SUMMARY OF THE INVENTION

The present invention has been proposed under the circumstances described above, and its object is to provide a semiconductor device free from the above-discussed problems.

According to the present invention, there is provided a semiconductor device which includes: a first one-piece lead including an enlarged end; a semiconductor chip mounted on the enlarged end; a second one-piece lead including a flexible end connected to the chip and an outer end; and a resin package for enclosing the enlarged end, the chip and the flexible end. The first and the second leads may partially project from the package in the opposite directions. To prevent the inner portion of the second lead from damaging the package, the flexible end of the second lead is rendered smaller in width than its outer end projecting from the package.

Preferably, the width of the flexible end of the second lead may be equal to θ×the width of the enlarged end of the first lead, where $0.4 \leq \theta \leq 0.6$.

Preferably, the length of the flexible end may be greater than half the total length of the second lead.

Preferably, the flexible end may includes a first portion and a second portion, wherein the first portion is connected to the chip via a conductive material, while the second portion extends from the first portion at a predetermined angle. With such an arrangement, the flexible end of the second lead can be sufficiently long without increasing the size of the resin package.

In a preferred embodiment, the first portion of the flexible end may be generally parallel to the enlarged end of the first lead.

Preferably, the first portion of the flexible end may be longer than the second portion, so that the first portion is more flexible than the second portion.

In the preferred embodiment of the present invention, the package includes a top surface and a bottom surface opposite to the top surface, wherein the first portion is disposed closer to the top surface than to the bottom surface.

Preferably, the first and the second leads may be exposed in the bottom surface of the package, so that the two leads are reliably soldered to a printed circuit board.

Other features and advantages of the present invention will become apparent from the detailed description given below with reference to the accompanying drawings.

DETAILED DESCRIPTION OF THE PREFERRED EMBODIMENTS

Figure 1:
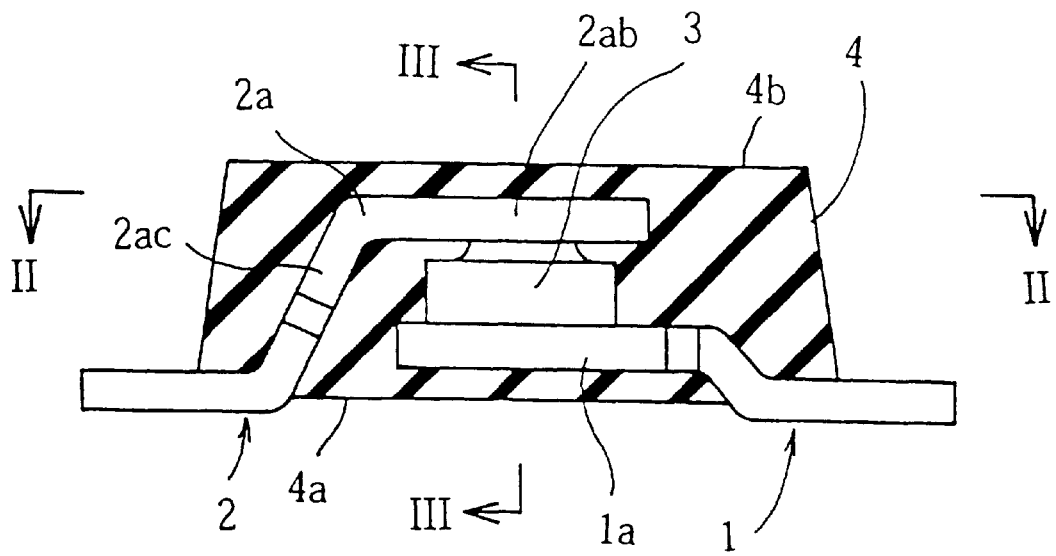
FIG. 1 is a sectional side view showing a package type semiconductor device embodying the present invention.

The preferred embodiment of the present invention will be described below with reference to FIGS. 1–4 of the accompanying drawings.

The illustrated device includes a first lead 1, a second lead 2, a semiconductor chip 3 and a resin package 4. The chip 3 is entirely enclosed by the package 4 (made of e.g. a thermosetting synthetic resin), while the first and the second leads 1, 2 partially project horizontally from the package 4 in the opposite directions. The two leads 1 and 2 are exposed in the bottom surface 4a of the package 4, so that these leads are reliably soldered to e.g. a printed circuit board A (see FIG. 4). Each of the first and second leads 1, 2 is a one-piece element which may be made by punching a metal plate.

Figure 2:
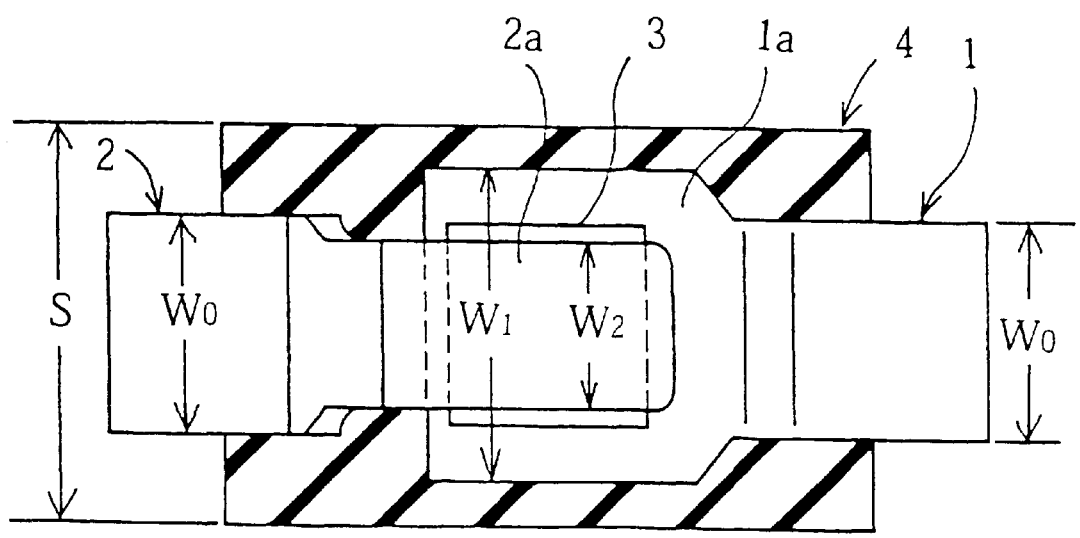
FIG. 2 is a plan view taken along lines II—II in FIG. 1.
Figure 3:
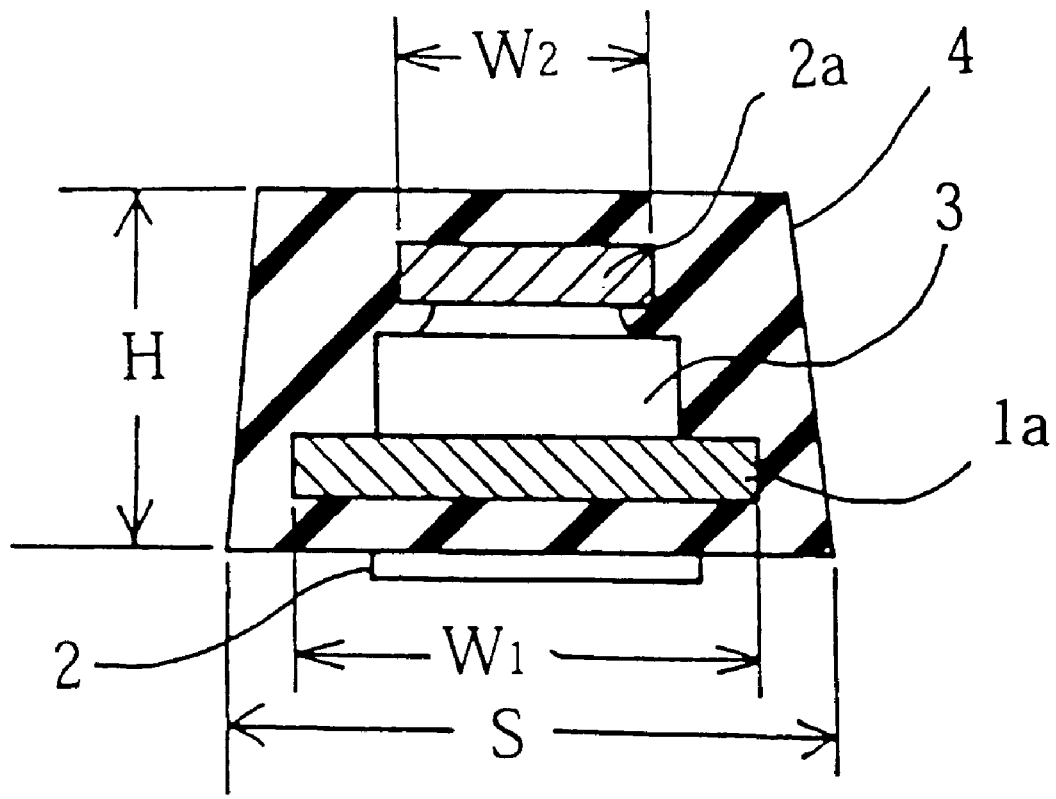
FIG. 3 is a sectional view taken along lines III—III in FIG. 1.
Figure 4:
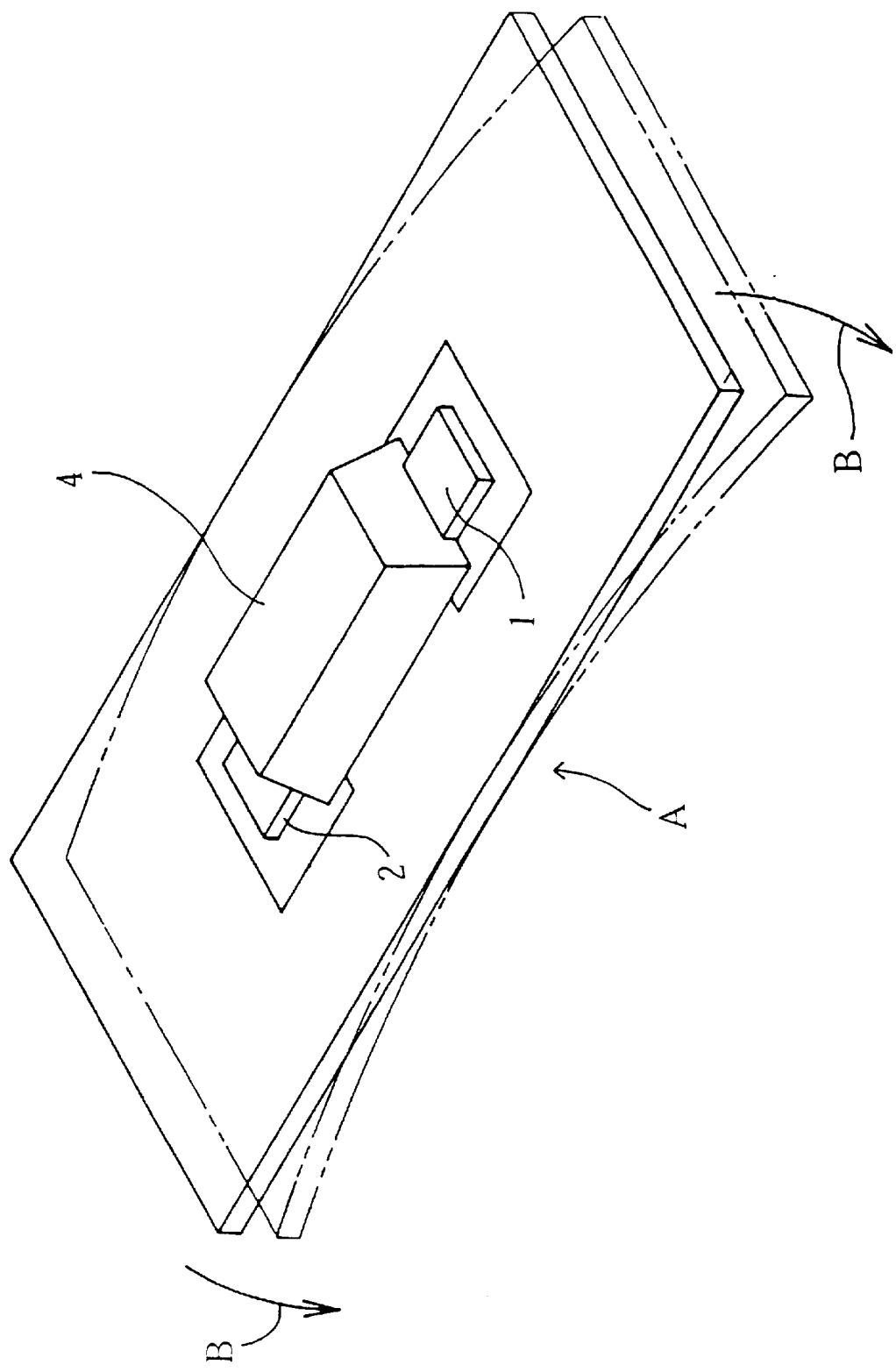
FIG. 4 illustrates the situation where the printed circuit board mounting the semiconductor device is bent.

As best shown in FIG. 2, the first lead 1 includes an enlarged inner portion 1a upon which the chip 3 is mounted. The width W1 of the enlarged portion 1a is greater than the width W0 of the projecting end of the lead 1. The enlarged portion 1a is disposed closer to the bottom surface 4a of the package 4 than to the top surface 4b of the package.

The second lead 2 includes a relatively flexible portion 2a whose width W2 is smaller than the width of the projecting end of the lead 2. The projecting end of the lead 2, as shown in FIG. 2, has the same width (W0) as the projecting end of the first lead 1 (thus, W2<W0<W1). As can be seen from FIG. 1, the flexible portion 2a is longer than half the entire length of the second lead 2, and is divided into two parts: a relatively long horizontal part 2ab and a relatively short slant part 2ac which extends from the horizontal part 2ab at a predetermined angle. This angle may be in a range of 90–180 degrees. The horizontal part 2ab is arranged in parallel to the enlarged portion 1a of the first lead 1, with the chip 3 disposed between the horizontal part 2ab and the enlarged portion 1a. The horizontal part 2ab is located closer to the top surface 4b of the package 4 than to the bottom surface 4a of the package. The horizontal part 2ab is connected to the chip 3 by a conductive material.

Figure 5:
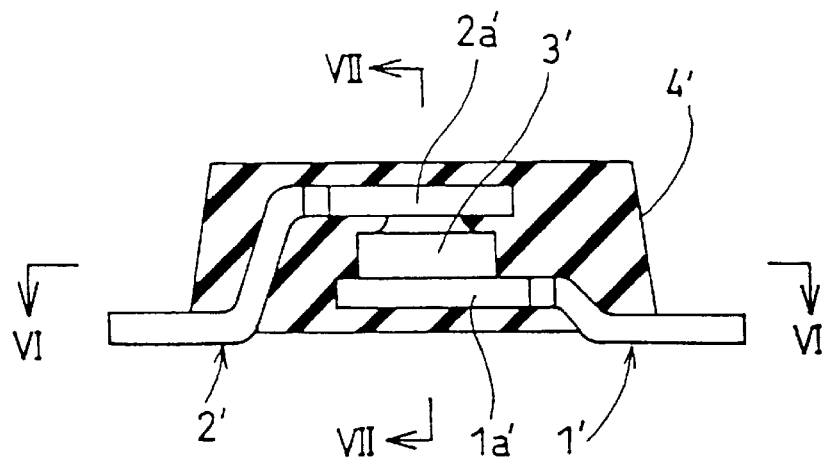
FIGS. 5–7 show a conventional semiconductor device.
Figure 6:
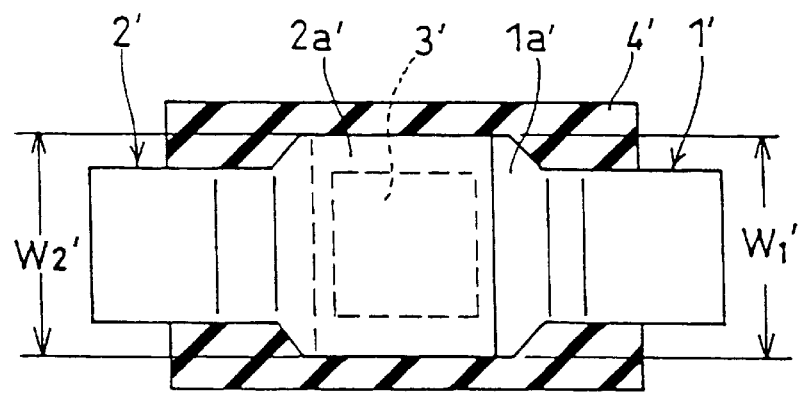

According to the illustrated embodiment, the flexible portion 2a can be deformed accordingly together with the resin package 4. Thus, as opposed to the conventional device shown in FIGS. 5–7, the second lead 2 will cause no cracks in the package 4 when the circuit board A is bent, as shown by the arrow B in FIG. 4. Preferably, the width W2 of the flexible portion 2a may be $\theta$ times the width W1 of the enlarged portion 1a of the first lead 1, where $0.4 \leq \theta \leq 0.6$.

Figure 8:
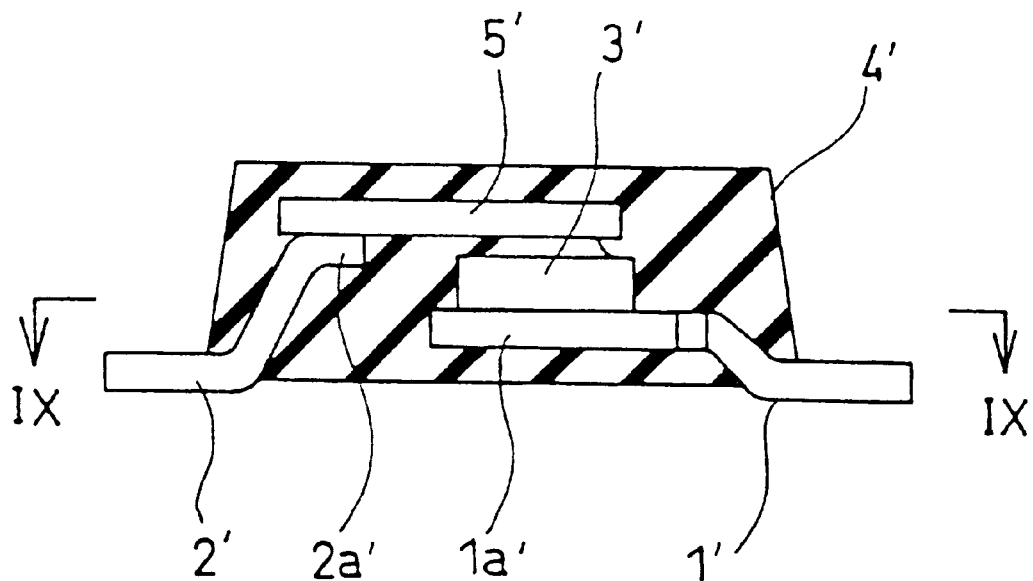
FIGS. 8 and 9 show a different type of a conventional semiconductor device.
Figure 9:
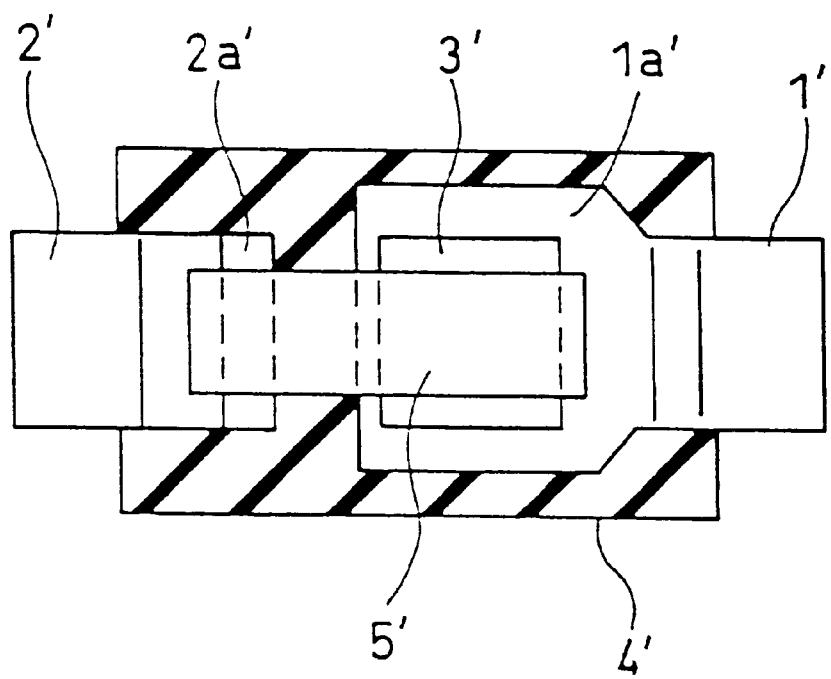

Further, since the flexible portion 2a is formed integral with the remaining portion of the second lead 2, as opposed to the other conventional device shown in FIGS. 8 and 9, the unfavorable heat generated by the chip 3 is efficiently conducted to every part of the second lead 2. To achieve proper heat conduction, the above-mentioned parameter $\theta$ may not be smaller than 0.4.

Figure 7:
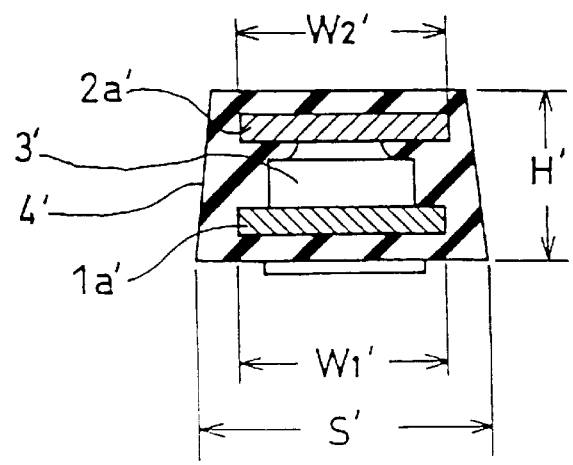

According to the present invention, the height H and/or the width S of the package 4 (see FIG. 3) can be made smaller than is conventionally possible. Specifically, the height H of the package 4 can be about 0.85 times the height H' of the package 4' of the conventional device (FIG. 7).

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A semiconductor device comprising:
   a first one-piece lead including an outer end and an enlarged inner end wider than the outer end;
   a semiconductor chip mounted on the enlarged end;
   a second one-piece lead including a flexible inner end connected to the chip and an outer end; and
   a resin package for enclosing the enlarged end, the chip and the flexible inner end;
   wherein the flexible inner end includes a first portion and a second portion, the first portion including any part of the flexible inner end connected to the chip via a conductive material, the second portion extending from the first portion at an angle; and
   wherein the first portion and at least part of the second portion have a constant width, the first portion being entirely narrower than the outer end of the second lead and the chip.

2. The semiconductor device according to claim 1, wherein the width of the first portion of the flexible inner end is equal to $\theta\times$ the width of the enlarged end, where $0.4 \leq \theta \leq 0.6$.

3. The semiconductor device according to claim 1, wherein a length of the flexible inner end is greater than half a length of the second lead.

4. The semiconductor device according to claim 1, wherein the first portion is generally parallel to the enlarged inner end.

5. The semiconductor device according to claim 1, wherein the first portion is longer than the second portion.

6. The semiconductor device according to claim 1, wherein the package includes a top surface and a bottom surface opposite to the top surface, the first portion being disposed closer to the top surface than to the bottom surface.

7. The semiconductor device according to claim 6, wherein the first and the second leads are exposed in the bottom surface of the package.

\* \* \* \* \*